United States Patent [19]
Nguyen

[11] Patent Number: 5,323,047
[45] Date of Patent: Jun. 21, 1994

[54] STRUCTURE FORMED BY A METHOD OF PATTERNING A SUBMICRON SEMICONDUCTOR LAYER

[75] Inventor: Loi N. Nguyen, Carrollton, Tex.

[73] Assignee: SGS-Thomson Microelectronics, Inc., Carrollton, Tex.

[21] Appl. No.: 828,734

[22] Filed: Jan. 31, 1992

[51] Int. Cl.$^5$ ............................................. H01L 23/48
[52] U.S. Cl. ................................. 257/384; 257/640; 257/637; 257/758; 257/751; 257/774; 257/900
[58] Field of Search ............... 257/750, 900, 773, 774, 257/760, 758, 752, 753, 649, 650, 637, 640, 641, 644, 639, 382, 383, 384, 377, 751, 754

[56] References Cited

U.S. PATENT DOCUMENTS

| | | | |
|---|---|---|---|
| 4,523,963 | 6/1985 | Ohta et al. | 257/644 X |
| 4,782,037 | 11/1988 | Tomozawa et al. | 257/644 X |
| 4,783,237 | 11/1988 | Aine et al. | 437/15 |
| 4,966,865 | 10/1990 | Welch et al. | 257/588 X |
| 5,043,790 | 8/1991 | Butler | 257/383 |
| 5,055,423 | 10/1991 | Smith et al. | 437/187 |
| 5,126,231 | 6/1992 | Levy | 430/313 |

*Primary Examiner*—William Mintel
*Attorney, Agent, or Firm*—Kenneth C. Hill; Lisa K. Jorgenson; Richard K. Robinson

[57] ABSTRACT

A method is provided for patterning a submicron semiconductor layer of an integrated circuit, and an integrated circuit formed according to the same. An interlevel dielectric layer is formed over the surface of the integrated circuit. A substantially planarizing layer is formed over the interlevel dielectric layer. A photoresist layer is formed and patterned over the planarizing layer. The planarizing layer is etched to form openings exposing selected portions of the interlevel dielectric layer, wherein each opening has substantially the same lateral dimensions. The photoresist and planarizing layers are then removed. The interlevel dielectric layer is etched in the openings to expose portions of the underlying integrated circuit.

9 Claims, 3 Drawing Sheets

STRUCTURE FORMED BY A METHOD OF PATTERNING A SUBMICRON SEMICONDUCTOR LAYER

FIELD OF THE INVENTION

The present invention relates generally to semiconductor integrated circuit processing, and more specifically to patterning a submicron semiconductor layer.

BACKGROUND OF THE INVENTION

With the trend to continue to miniaturize semiconductor integrated circuits to achieve submicron feature sizes, photolithography has become one of the most critical steps in semiconductor manufacturing. The goal of photolithography in establishing the critical dimensions of the various devices and circuits is to create a pattern which meets design requirements as well as to correctly align the circuit pattern on the surface of the wafer.

As line widths shrink smaller and smaller in submicron photolithography, the process of printing lines and contact holes in photoresist becomes increasingly more difficult. Photoresists have been developed to keep pace with the industry's need to print narrower lines with fewer defects. The selection of the photoresist must be made on whether the photoresist has the capability of producing the design dimensions. A thinner resist layer will generally improve the capability of printing smaller feature sizes. However, the resist must simultaneously be thick enough to act as an etchant barrier and be free of pinholes.

The smallest equal lines and spaces that can be formed in the photoresist layer is known as the resolution capability. Thinner photoresist film thicknesses will improve the resolution capability.

As circuits increase in the number of layers, the wafer surface becomes less planar. The resolution of small image sizes is further reduced due to the difference in the topography areas in which the photoresist thickness becomes uneven across the wafer surface. When the exposure radiation is directed at the wafer surface at a 90° angle to the surface, a well-defined image is created in the photoresist because the exposing waves reflect up and down in the resist. If, however, any of the exposing radiation waves reflect at angles other than 90° up from the surface beneath the photoresist, unwanted portions of the photoresist will be exposed. Variations in the subsurface topography intensify the problem of reflection. The sidewalls of the steps, for example, reflect the radiation at various angles, causing poor image resolution. A smooth surface under the photoresist will eliminate much of the reflection problems.

In addition, where the surface beneath the photoresist is uneven, the exposure time of the photoresist must be sufficient to expose the photoresist at its thickest depth. This means that the thinner areas of photoresist will be over exposed, resulting in wider lateral openings or narrower lines which will produce poorer image resolution.

It would be desirable to provide a fabrication technique having a planarized surface beneath the photoresist layer to achieve better image resolution and smaller image-size openings. It would further be desirable for such technique to use a thin photoresist to achieve smaller line openings. It would also be desirable for such fabrication technique to be easily adapted for use with standard integrated circuit process flows.

SUMMARY OF THE INVENTION

The invention may be incorporated into a method for forming a semiconductor device structure, and the semiconductor device structure formed thereby, by forming a non-planar layer over the integrated circuit. A planarizing layer is formed over the non-planar layer. A thin photoresist layer is formed and patterned over the planarizing layer, wherein the thickness of the photoresist layer is determined by the etch rate of the planarizing layer to the photoresist layer and the thickness of the planarizing layer at the planarizing layer's thickest point. The planarizing layer is etched using the photoresist layer as a mask and the non-planar layer is etched using the planarizing layer as a mask.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of illustrative embodiments when read in conjunction with the accompanying drawings, wherein:

DETAILED DESCRIPTION OF THE PREFERRED EMBODIMENTS

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
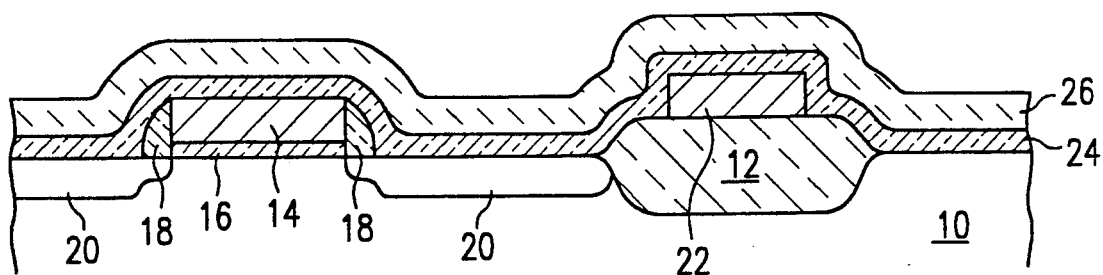
FIGS. 1–10 are cross-sectional views of the fabrication of a semiconductor device structure according to the present invention.

Referring to FIG. 1, an integrated circuit device is to be formed on a silicon substrate 10. A field oxide region 12 is formed on the substrate to separate active areas. A conductive structure such as a transistor gate is formed on the substrate by known methods comprising gate electrode 14 disposed over a gate oxide 16. The transistor will also comprise oxide spacers 18 and source/drain regions 20. Another conductive structure 22 may be formed over the field oxide region 12 such as a polysilicon signal line. An interlevel dielectric layer is formed over the integrated circuit. This layer may comprise an undoped oxide layer 24 typically having a thickness of between approximately 1000 to 2000 angstroms. A conformal borophosphorous silicate glass (BPSG) layer 26 is formed over the oxide layer 24. Layer 26 will typically have a thickness of between approximately 5000 to 6000 angstroms.

Figure 2:
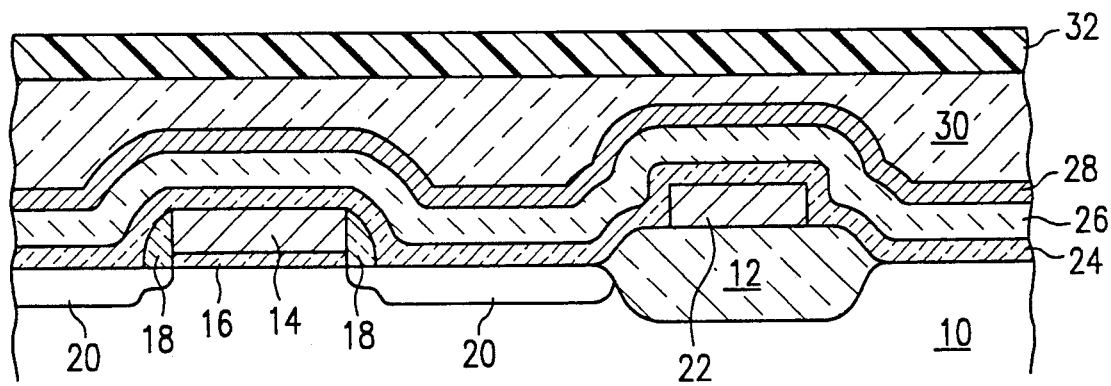

Referring to FIG. 2, an etch stop layer 28 if formed over the conformal interlevel dielectric layer 24, 26. The etch stop layer 28 may formed from any material suitable for semiconductor processing which has a high etch selectivity to oxide. Layer 28 will typically have a thickness of between approximately 500 to 1000 angstroms. Preferably, layer 28 comprises titanium nitride or tantalum disilicide. A planarizing layer 30 such as spin-on-glass (SOG) is formed over the etch stop layer 28. If SOG is used, it may be cured to form a planarized silicon dioxide film. Layer 30 will typically have a nominal thickness of between approximately 5000 to 7000 angstroms. The thickness of layer 30 will depend upon the topography of the underlying non-planar layer 28. A thin photoresist layer 32 is formed over the planarizing layer 30.

Figure 3:
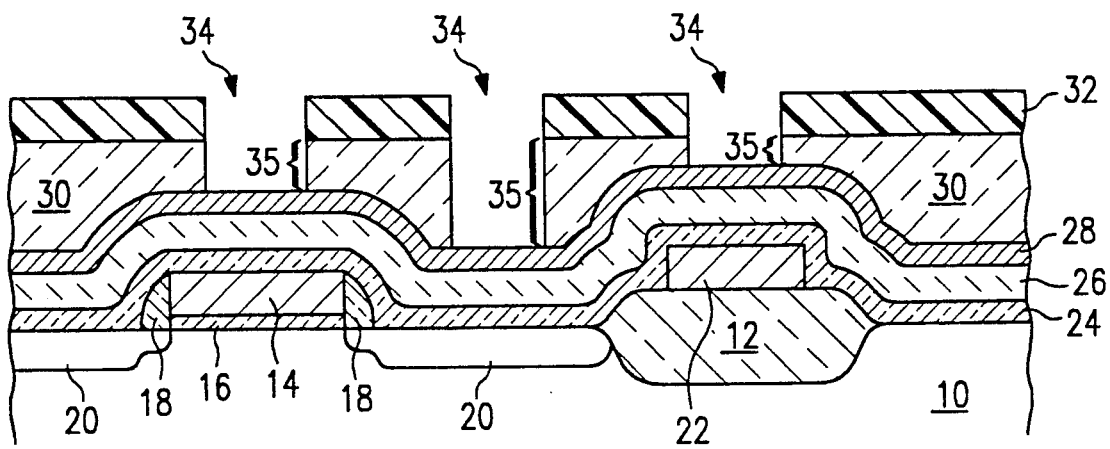
Figure 4:
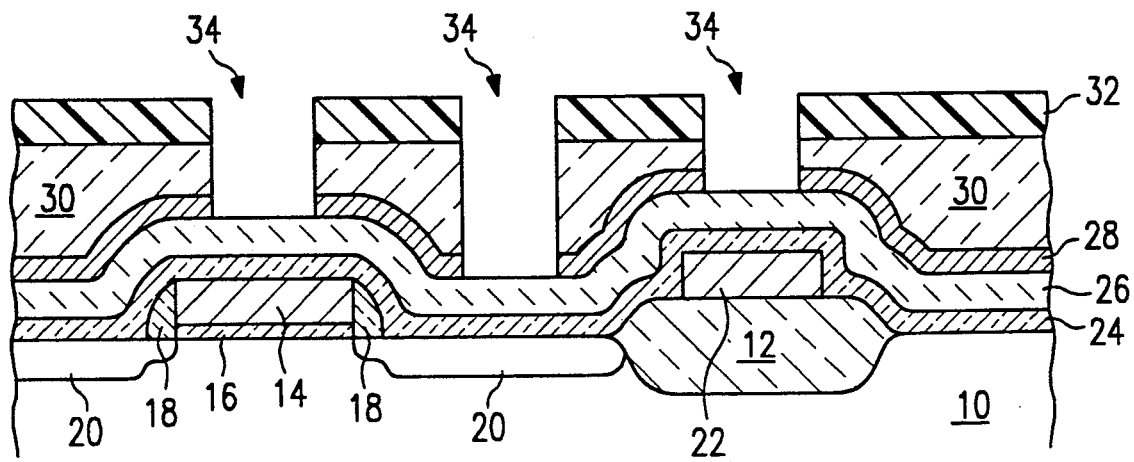

Referring to FIG. 3, the photoresist layer 32 is patterned to form openings 34. The planarizing layer 30 is etched away in opening 34 using layer 28 as an etch stop. Referring to FIG. 4, the etch stop layer 28 is etched in opening 34 exposing the BPSG layer 26 in the opening.

Figure 5:
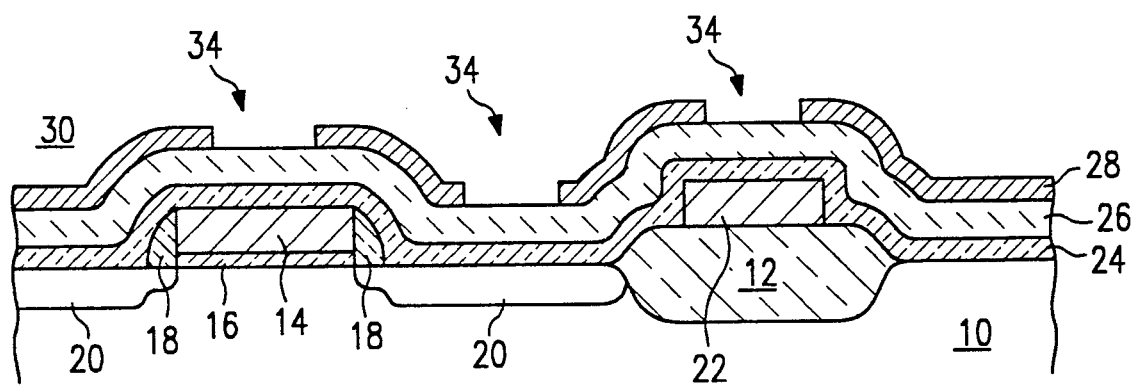

Referring to FIG. 5, the photoresist layer 32 and the planarizing layer 30 are removed exposing the etch stop layer 28. The removal of the photoresist layer 32 may be done by a plasma oxygen etch process. The removal of the planarizing layer 30 may be done in a diluted hydrofluoric acid solution.

Figure 6:
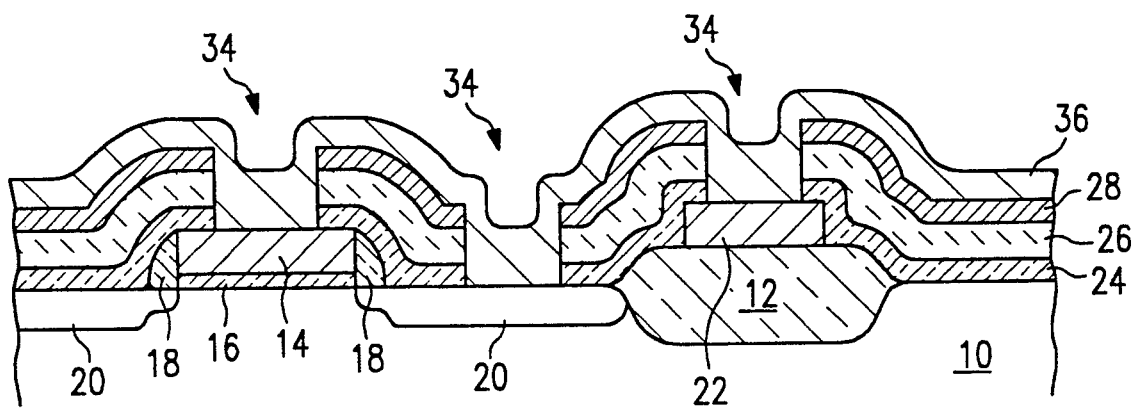

Referring to FIG. 6, the interlevel dielectric layer comprising oxide layer 24 and BPSG layer 26 is etched in the openings 34 exposing the active areas beneath the layer. For example, the gate electrode 14, source/drain region 20 and gate or signal line 18 are exposed. A conductive layer 36 is then formed over the etch stop layer 28 and in the openings 34 making contact with the underlying conductive structures. The etch stop layer 28 may be removed before the conductive layer 36 is formed.

Figure 7:
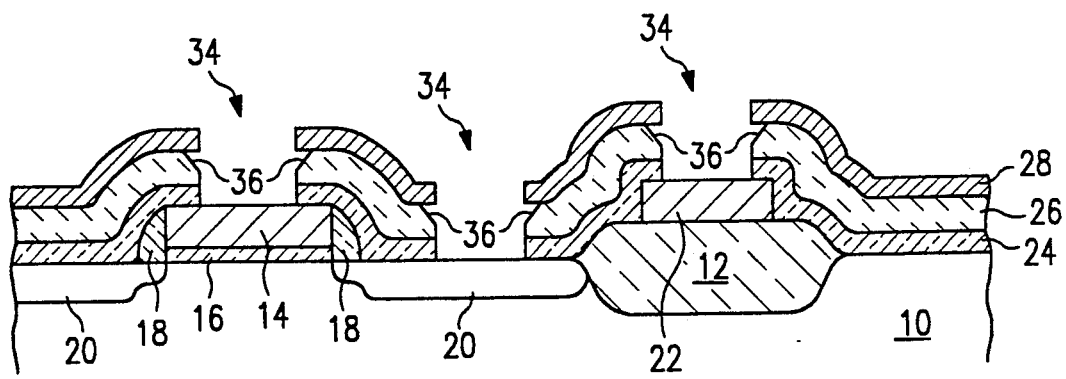
Figure 8:
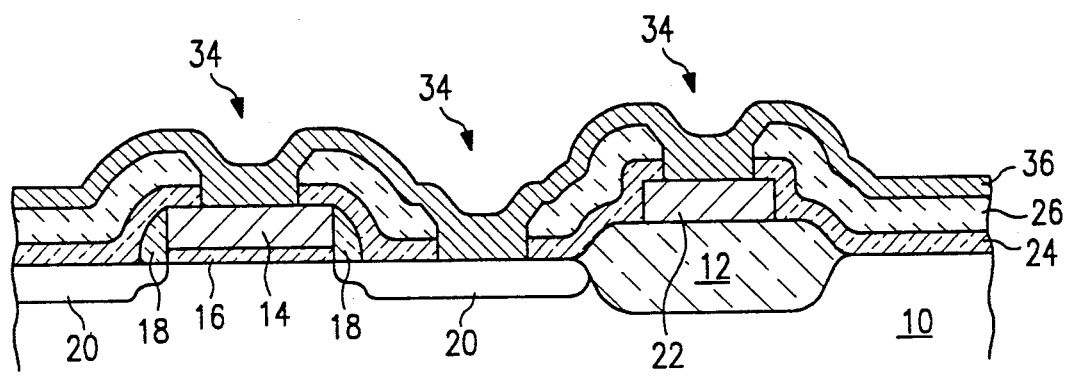

Referring to FIG. 7, the BPSG layer 26 may first be isotropically etched to form sloped sidewalls 36 in the openings 34 toward the upper portion of the sidewall. An anisotropic etch is then performed to form the vertical sidewalls through the lower portion of the BPSG layer 26 and the underlying oxide layer 24. If an isotropic etch is first performed, the etch stop layer 28 is removed after the interlevel dielectric layer is etched exposing portions of the active areas underlying the interlevel dielectric layer. A conductive layer 36 is then formed over the interlevel dielectric layer and in the openings 34 as shown in FIG. 8. The sloped sidewalls will improve step coverage of the conductive layer into the openings 34.

Figure 9:
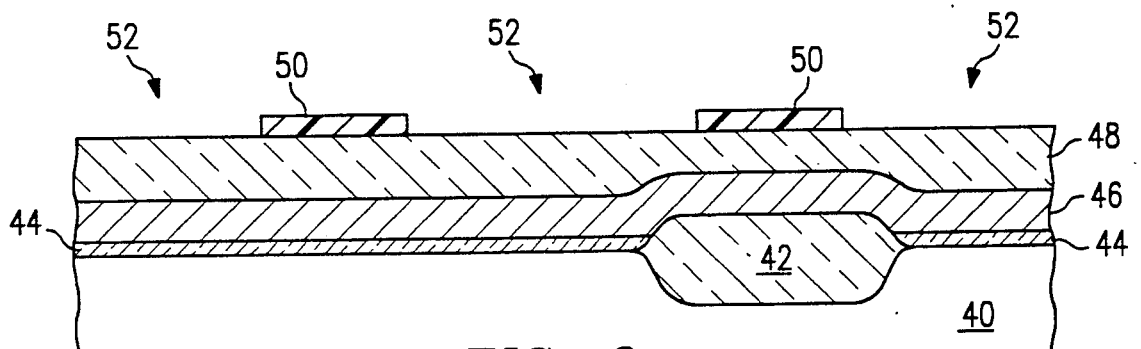

Referring to FIG. 9, an alternative embodiment is shown. An integrated circuit device is to be formed on a silicon substrate 40. A field oxide region 42 is formed on the substrate to separate active areas. An oxide layer 44 is formed over the integrated circuit. A conformal conductive layer 46 is formed over the oxide layer 44. The conformal layer 46 may be a doped polysilicon or a layer such as a polycide. A planarizing layer 48 is formed over the conformal conductive layer 46. The planarizing layer may be a spin-on-glass which has a sufficient thickness to be substantially planar across an upper surface. A thin photoresist layer 50 is formed on the planarizing layer 48. The photoresist is patterned to form openings 52.

Figure 10:
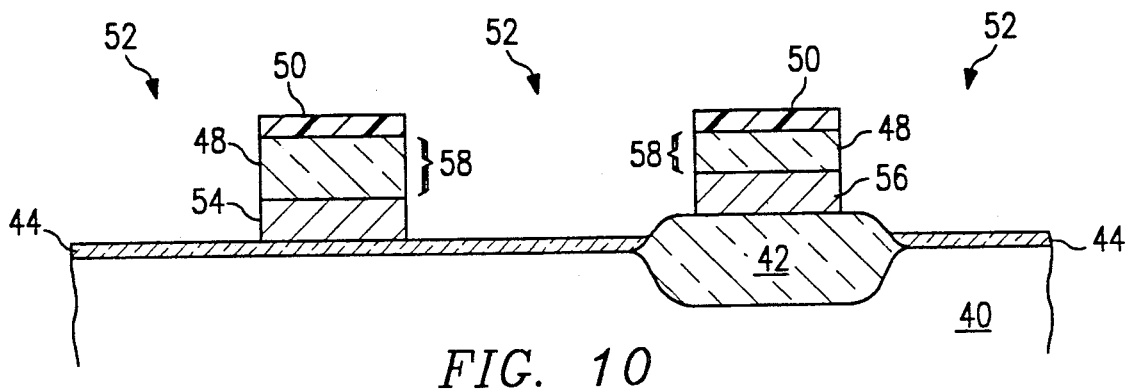

Referring to FIG. 10, the planarizing layer 48 is etched in the openings 52 using the photoresist layer 50 as a mask. The conformal layer 46 acts as an etch stop during the etching of the planarizing layer 48. The conformal layer 46 is then etched using the planarizing layer 48 as a mask. The conformal layer remaining may be, for example, a gate electrode 54 of a transistor or a signal line 56. In forming the planarizing layer 48 between the conformal layer and the photoresist, a thinner photoresist can be used which provides for smaller image resolution and uniform dimensions.

The planarization of the layer 30, as shown in FIG. 2, also allows for a thin layer of photoresist 32 to be used. Reflection problems from layer 30 are minimized because there is no varying topography to reflect the exposure radiation at different angles. Using a thin photoresist, smaller lines and smaller openings can be uniformly made across the surface of the planarizing layer 30. This will improve the resolution capability, as shown in FIG. 3. The resolution capability of the photoresist can be expressed as:

$$\text{RESOLUTION} = K \frac{\text{WAVELENGTH}}{\text{NUMERICAL APERTURE}}$$

The wavelength and numerical aperture values are fixed values determined by the exposure tools used in the process. Thus, the resolution can be improved or made smaller by lowering the K factor. The K factor is lowered as the photoresist layer is made thinner. The thickness of the photoresist is determined by the etch selectivity of the planarizing layer to the photoresist layer and the thickness of the planarizing layer at its thickness point as shown by reference numeral 35 in FIG. 3 and reference numeral 58 in FIG. 10. For example, if the etch selectivity of the planarizing layer to the photoresist layer is 2:1 and the depth of the planar layer at its thickest point is 4000 angstroms, then the photoresist layer must be at least 2000 angstroms thick. Any additional thickness of the photoresist layer will decrease the image resolution but may insure that the photoresist layer is pinhole free.

The etch stop layer 28, shown in FIG. 3, will act as an etch stop during the etching process of the planarizing layer 30. If layer 30 were absent, the depth of the planarizing layer would be greater because the etch process would continue through the interlevel dielectric layer 24, 26. With the etch stop layer 30 present, the thickest point of the planarizing layer 30 is minimized, thus allowing for a thinner photoresist layer 32 and better image resolution. The result is that the best possible image resolution can be achieved while the horizontal dimensions of each of the contacts or vias can be made uniform.

As will be appreciated by those skilled in the art, the process steps described above can be used with nearly any conventional process flow. While the invention has been particularly shown and described with reference to a preferred embodiment, it will be understood by those skilled in the art that various changes in form and detail may be made therein without departing from the spirit and scope of the invention.

What is claimed is:

1. An integrated circuit structure, comprising:
    a conductive region in a semiconductor substrate;
    an undoped oxide layer over the substrate and the conductive region;
    a doped oxide layer over the undoped oxide layer;
    an etch stop layer over the doped oxide layer; and
    an opening through the etch stop layer, the doped oxide layer, and the undoped oxide layer to expose a portion of the conductive region.

2. The structure of claim 1, further comprising a conductive interconnect structure over the etch stop layer and extending into the opening to contact the conductive region.

3. The structure of claim 1, wherein the etch stop layer is tantalum disilicide.

4. The structure of claim 1, wherein the etch stop layer is titanium nitride.

5. An intermediate structure utilized in the formation of an integrated circuit device, comprising:
- a semiconductor substrate;
- a first plurality of conductive structures formed in the substrate;
- a second plurality of conductive structures formed over the substrate;
- a first interlevel dielectric layer of undoped oxide over the substrate and the second plurality of conductive structures, wherein the first interlevel dielectric layer has an uneven topography;
- a second interlevel dielectric layer of doped oxide over the first interlevel dielectric layer, wherein the second interlevel dielectric layer conforms to the topography of the first interlevel dielectric layer, thereby having an uneven topography;
- an etch stop layer over the second interlevel dielectric layer, wherein the etch stop layer conforms to the topography of the second interlevel dielectric layer, thereby also having an uneven topography;
- a planarizing layer over the etch stop layer, the planarizing layer having a substantially planar upper surface; and
- photoresist layer over the planarizing layer.

6. The structure of claim 5, wherein the etch stop layer is tantalum disilicide.

7. The structure of claim 5, wherein the etch stop layer is titanium nitride.

8. The structure of claim 5, further comprising a plurality of openings through the photoresist and planarizing layers to expose portions of the etch stop layer.

9. The structure of claim 8, further comprising a plurality of openings in the etch sop layer coinciding with the openings through the photoresist and planarizing layers, and exposing portions of the second interlevel dielectric layer therethrough.

* * * * *